United States Patent
Otremba

(10) Patent No.: US 8,023,276 B2
(45) Date of Patent: Sep. 20, 2011

(54) CIRCUIT ARRANGEMENT COMPRISING HAVING PLURALITY OF HALF BRIDGES

(75) Inventor: Ralf Otremba, Kaufbeuren (DE)

(73) Assignee: Infineon Technologies AG, Munich (DE)

( * ) Notice: Subject to any disclaimer, the term of this patent is extended or adjusted under 35 U.S.C. 154(b) by 901 days.

(21) Appl. No.: 11/550,165

(22) Filed: Oct. 17, 2006

(65) Prior Publication Data

US 2007/0120217 A1   May 31, 2007

(30) Foreign Application Priority Data

Oct. 17, 2005   (DE) .................. 10 2005 049 978

(51) Int. Cl.
*H05K 7/02* (2006.01)
*H05K 7/06* (2006.01)
*H05K 7/08* (2006.01)
*H05K 7/10* (2006.01)

(52) U.S. Cl. .................. 361/760; 361/777; 361/780

(58) Field of Classification Search .......... 363/141–144; 361/777–780
See application file for complete search history.

(56) References Cited

U.S. PATENT DOCUMENTS

| | | | |
|---|---|---|---|
| 5,502,289 A | 3/1996 | Takiar et al. | |
| 6,031,279 A * | 2/2000 | Lenz | 257/686 |
| 6,424,550 B2 * | 7/2002 | Grundl et al. | 363/141 |
| 6,700,793 B2 * | 3/2004 | Takagawa et al. | 361/777 |
| 6,839,252 B2 | 1/2005 | Tai et al. | 363/65 |
| 7,053,474 B2 | 5/2006 | Otremba | 257/685 |
| 2002/0093094 A1 | 7/2002 | Takagawa et al. | 257/723 |
| 2004/0125573 A1 | 7/2004 | Joshi et al. | 361/723 |

FOREIGN PATENT DOCUMENTS

| | | |
|---|---|---|
| DE | 196 35 582 C1 | 2/1998 |
| DE | 103 03 932 A1 | 3/2004 |
| DE | 102 43 885 A1 | 4/2004 |
| DE | 103 03 463 A1 | 8/2004 |
| WO | 2004/027993 A2 | 4/2004 |

* cited by examiner

*Primary Examiner* — Tuan T Dinh
(74) *Attorney, Agent, or Firm* — Banner & Witcoff, Ltd.

(57) ABSTRACT

A circuit arrangement for buck converters has a multiplicity of half bridges (10, 11). Each half bridge (10, 11) contains a first chip ($HS_1$, $HS_2$, $HS_3$, $HS_4$) and a second chip ($LS_1$, $LS_2$, $LS_3$, $LS_4$), the first chip ($HS_1$, $HS_2$, $HS_3$, $HS_4$) and the second chip ($LS_1$, $LS_2$, $LS_3$, $LS_4$) in each case having a vertical power transistor. The load paths of the power transistor of the first chip ($HS_1$, $HS_2$, $HS_3$, $HS_4$) and of the power transistor of the second chip ($LS_1$, $LS_2$, LS3, $LS_4$) are connected in series. The control inputs ($G_1$, . . . , $G_8$) of the power transistors can be driven individually. The half bridges (10, 11) are jointly accommodated in a semiconductor package and the first chip ($HS_1$, HS2, HS3, $HS_4$) and the second chip ($LS_1$, $LS_2$, LS3, $LS_4$) lie above one another in each half bridge (10, 11).

17 Claims, 4 Drawing Sheets

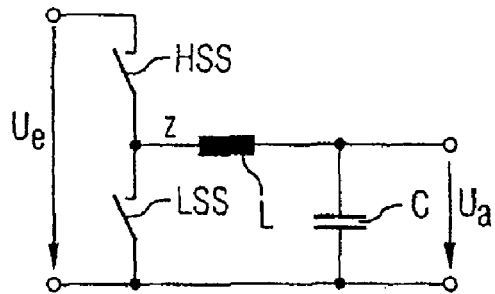
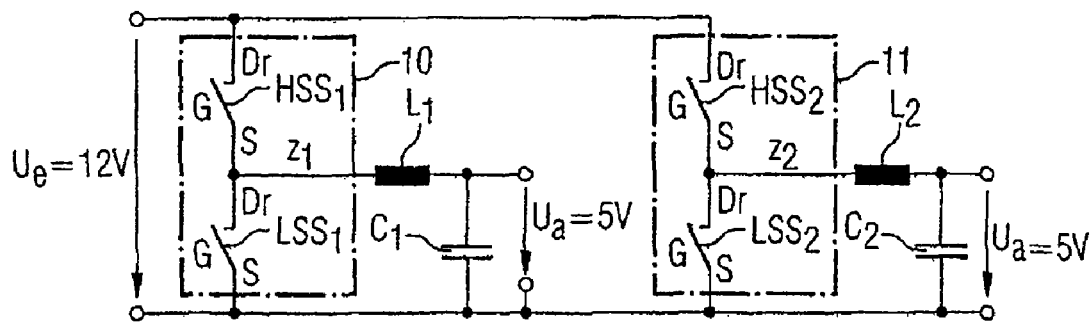
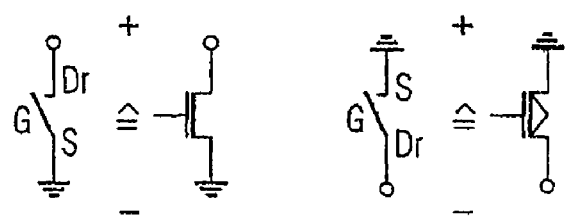
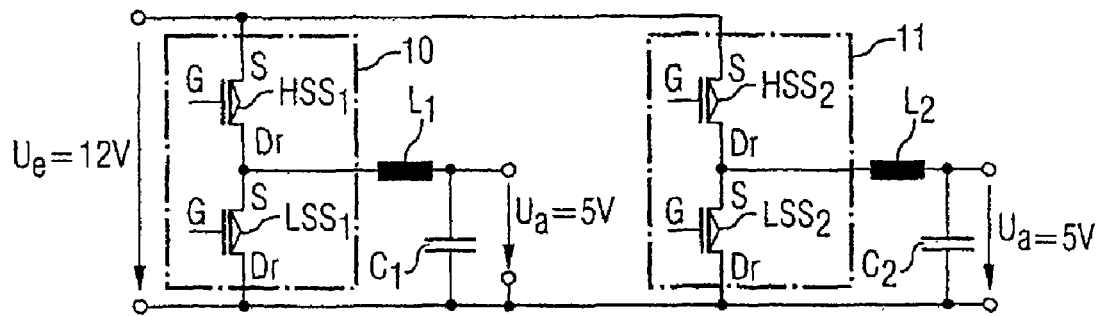

US 8,023,276 B2

CIRCUIT ARRANGEMENT COMPRISING HAVING PLURALITY OF HALF BRIDGES

PRIORITY

This application claims priority from German Patent Application No. DE 10 2005 049 978.3, which was filed on Oct. 17, 2005, and is incorporated herein by reference in its entirety.

TECHNICAL FIELD

The invention relates to a circuit arrangement for Buck converters and a method for producing a power semiconductor component for Buck converters.

BACKGROUND

Buck converters are converter circuits for converting a DC input voltage into a DC output voltage. As shown in DE 102 43 885, a known Buck converter topology has at its input a half bridge with a first switching element and a second switching element. An inductance is connected between the node which is between the switching elements, and a load. The switching elements are in each case alternately driven, for example by means of pulse-width control. Such Buck converters are used especially for the voltage supply of microprocessors, e.g. in PCs.

In this context, multi-phase Buck converters are also used as described in U.S. Pat. No. 6,839,252. In this arrangement, the Buck converters contain a number of half bridges of in each case two power transistors. The power transistors are switched on and off by different phases and thus at different times. The current is thus distributed over a number of half bridges in order not to overload the power transistors located in the half bridges. In addition, the ripple of the output voltage is reduced since the switching-on and switching-off processes are distributed over a number of phases. However, providing the large number of power transistors means increased space and circuit expenditure.

SUMMARY

A circuit arrangement may comprise a multiplicity of half bridges. Each half bridge may contain a first chip and a second chip, both of which in each case have a vertical power transistor. The first chip and the second chip can be connected in such a manner that the load path of the power transistor of the first chip and the load path of the power transistor of the second chip are connected in series. This means that, for example the source-drain path in the case of a MOSFET and the collector-emitter path in the case of bipolar transistors are connected in series. The control inputs of the power transistors can be driven individually. The half bridges are jointly accommodated in a semiconductor package, the first chip and the second chip lying above one another in each half bridge.

BRIEF DESCRIPTION OF THE DRAWINGS

The invention is illustrated in greater detail in the drawings with reference to an exemplary embodiment.

FIG. 1 shows a half bridge for a buck converter.

FIG. 2 shows a multiplicity of half bridges of switching elements which are arranged according to an embodiment.

FIG. 3 shows details for exemplary embodiments of the switching elements according to FIG. 2.

FIG. 4 shows a circuit with two half bridges which are arranged in a power semiconductor component.

DETAILED DESCRIPTION

Figure 5:
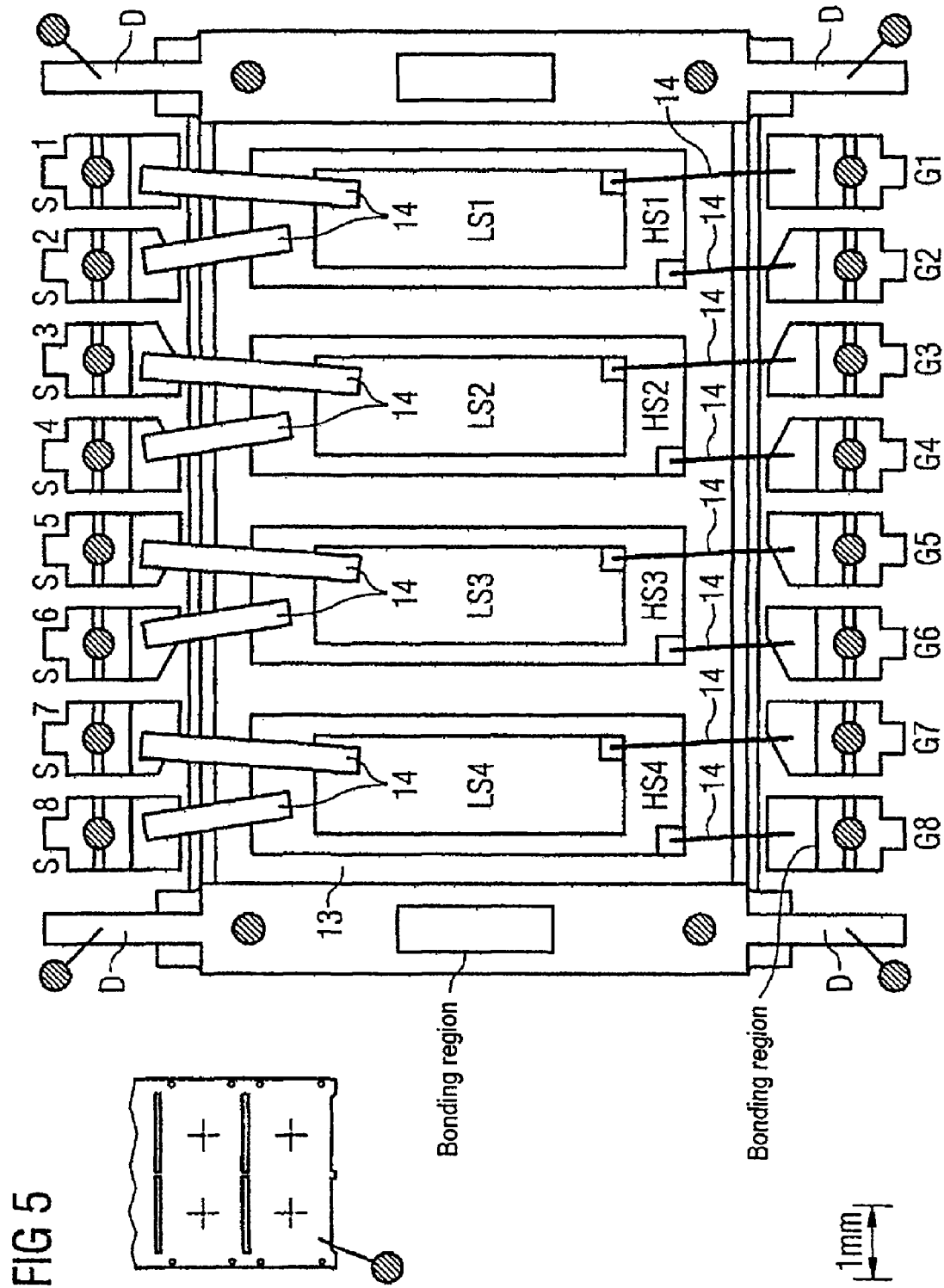
FIG. 5 shows a section through a power semiconductor component in which a circuit arrangement with n-channel MOSFETs is accommodated.

Accommodating the first and second chips of the half bridges in a single semiconductor package saves space. Due to the fact that the power transistors are accommodated in different chips, however, the size of the power transistors can be dimensioned independently of the size of the other chips. For example, this makes it possible to dimension the first chips of different half bridges differently. The fact that the power transistors can be driven individually also results in flexibility with respect to the time when the power transistors are switched on and off. The half bridges are located next to one another. The purpose of this is that the heat removal of the chips currently conducting current is not disturbed by chips of other half bridges.

The load path of the power transistor of the first chip is preferably electrically connected to the load path of the power transistor of the second chip by means of an electrically conductive solder or adhesive connection. This solder or adhesive connection at the same time connects the first chip in a surface-bonded manner to the second chip. This ensures that the distance between the first chip and the second chip is as small as possible which, on the one hand, minimizes the height of the arrangements of first and second chips and, at the same time, provides for low electrical resistance between the load paths.

In one embodiment, the first chip and the second chip can be connected to one another via a soft solder connection. Solder connections usually have a lower resistance than adhesive connections. In the case of soft solder connections, only relatively low temperatures, which cannot destroy the component, are needed to produce the connection.

If the connections of the power transistors of the first and the second chip which are opposite to one another are connected to one another via a diffusion solder connection, the distance between the two chips is reduced to a few micrometers which further reduces the resistance of the solder connection.

In one embodiment, the power transistors of the first chip and of the second chip are IGBTs (insulated-gate bipolar transistors). In an IGBT, the forward resistance is reduced, particularly in the range of high voltages, by the injection of minority carriers.

In another embodiment, the power transistors of the first and of the second chips are in each case bipolar power transistors.

The power transistors of the first and of the second chip can also be in each case power MOSFETs. In this arrangement, the current consumption is advantageously very low when the power transistor is switched off.

In one embodiment, the first chip is located on an electrically conductive substrate and is electrically conductively connected to the substrate by means of one of the two terminals of the load paths of the power transistor. In a MOSFET, for example, the drain terminal of the power transistor can be connected to the substrate. Via the electrically conductive substrate, the supply voltage can be connected to the first chip over the wide area of the substrate which keeps the terminal resistance low. This also saves additional wiring which would be space-consuming.

Providing bonding wires between the external terminals of the power semiconductor component and the control terminals of the first and second chips and the terminals of the load paths which are facing away from the substrate, reliably provides the external terminals of the power semiconductor component which is bounded by the semiconductor package.

In one embodiment, the input voltage can preferably be connected with its positive potential to the electrically conductive substrate and with its negative potential to the terminal for the load paths of the power transistors of the second chip which faces away from the first chip. As a result, those chips which must usually conduct a higher current are connected in a slightly better way to the electrically conductive substrate than the chips at the negative potential, from which a part of the current flows through the load.

In one embodiment, the first chip has a larger seating area than the second chip. As a result, the second chip can be easily mounted on the first chip.

In addition, freewheeling diodes which are connected in parallel with the power transistors of the semiconductor bridges can be accommodated in the semiconductor package.

In one embodiment, the circuit arrangement contains exactly four half bridges which are jointly accommodated in one P-DSO-20 package next to one another.

The circuit arrangement is particularly suitable for a multiphase buck converter which provides an output voltage for a load.

For each half bridge, an inductance can be connected between the load and the connection of the first chip and the second chip. The power transistors of the different half bridges are driven at different times which are defined by different phases. The space requirement, for example on the motherboard in PCs, is reduced for such a buck converter. In addition, the interconnection complexity has become less since the connection of the load paths of first chip and second chip has already been made.

The power transistors of the first and of the second chip are preferably of the same type of conductivity, that is to say either n-conducting or p-conducting.

The invention also relates to a method for producing a power semiconductor component. A multiplicity of first chips, which in each case have a vertical power transistor, is applied on a conductive substrate. In this arrangement, one terminal for the load path for the power transistor is in each case electrically conductively connected to the substrate. One second chip each is subsequently applied to one first chip each. The second chips in each case also contain vertical power transistors. The load path of the power transistor of the first chip is connected in series with the load path of the power transistor of the second chip.

External terminals can be provided for the control inputs and each power transistor has its own external terminal for its control input. Following this, the substrate, the first chips and the second chips are enclosed by a semiconductor package.

The terminals between the load paths are advantageously already provided during the production of the power semiconductor component and do not need to be provided subsequently in the application system, for example in the PC. In addition, this power semiconductor component is particularly small and can thus be built in in an application environment in a space-saving manner.

The second chips are preferably applied to the first chip by means of electrically conductive solder or adhesive connections. This provides for a low constructional height of the power semiconductor component.

The method is particularly well suited for a power semiconductor component which contains exactly four half bridges of one first and one second chip each and which is located in a P-DSO package.

The multi-chip-on-chip half bridge proposed here allows the space requirement to be reduced distinctly since now only the chip area of the lower power MOSFET is decisive and, in addition, the input supply for all phases is arranged on the chip support or the substrate, respectively. For example, the first and second chips consist of n-channel power MOSFETs. In this arrangement, the first chip is designated as HS MOSFET for high-side MOSFET and a second chip is designated as LS MOSFET for low-side MOSFET. In the chip-on-chip assembly according to an embodiment, the HS MOSFET is arranged at the bottom and the LS MOSFET is arranged at the top. This HS-LS module is arranged repeatedly in the power package depending on the number of phases needed.

The power transistors of the first chip can be accommodated in separate first chips. For a flexible assembly of different numbers of phases, it is advantageous to allocate only one HS MOSFET chip to each LS MOSFET. Thus, only one HS MOSFET design is necessary since otherwise a corresponding HS MOSFET design would be necessary for each number of phases.

FIG. 1 shows a circuit arrangement for a buck converter for converting an input voltage $U_e$ into an output voltage $U_a$. A first switching element HSS is connected between the positive potential of the input voltage $U_e$ and the intermediate node Z. The second switching element LSS is arranged between this intermediate node Z and the negative potential of the supply voltage $U_e$. Between the intermediate node Z and the positive potential of the output voltage $U_a$, the inductance L is connected. The capacitance C is located in parallel with the output voltage $U_a$. The negative potential of the output voltage $U_a$ and of the input voltage $U_e$ are connected to one another.

The first switching element HSS (high-side switch) and the second switching element LSS (low-side switch) form a half bridge.

The first switching element HSS and the second switching element LSS are in each case switched on and off via pulse-width modulation. This results in a voltage at the intermediate node Z which, however, fluctuates due to the switching-on and switching-off processes. These fluctuations are largely filtered out by the inductance L and the capacitor C so that the output voltage $U_a$ is an essentially constant voltage.

FIG. 2 shows a circuit for buck converters which is arranged according to an embodiment. The circuit according to FIG. 2 also represents a buck converter for converting an input voltage into an output voltage but, in contrast to FIG. 1, it is implemented by means of two half bridges.

A first half bridge 10 contains a first switching element $HSS_1$ and a second switching element $LSS_1$ which are connected in series between the positive potential and the negative potential of the input voltage $U_e$. In this arrangement, the first switching element $HSS_1$ is connected to the positive potential and the second switching element $LSS_1$ is connected to the negative potential. At the joint between the two switching elements of the first half bridge 10, the node $Z_1$ is located to which the first terminal of a first inductance $L_1$ is connected. The negative potential $U_e$ at the same time forms the negative potential of the output voltage $U_a$. The positive potential of the output voltage $U_a$ is picked up at the second terminal of the first inductance $L_1$. A first capacitor $C_1$ is connected between the positive and the negative potential of the output voltage $U_a$.

A second half bridge 11 is configured and connected exactly like the first half bridge 10. In detail, the first switching element $HS_2$ of the second buck converter 11 is located between the positive potential of the input voltage $U_e$ and the intermediate node $Z_2$. The second switching element $LS_2$ is located between the intermediate node $Z_2$ and the negative potential of the input voltage $U_e$ which is at the same time the negative potential of the output voltage $U_a$. The second inductance $L_2$ is connected between the intermediate node $S_2$ and the output voltage $U_a$. In addition, the second capacitor $C_2$ is arranged between the positive potential of the output voltage and the negative potential of the output voltage. Although the output voltage $U_a$ has been drawn in twice, this is only one voltage and not two voltages.

At the switching elements $HSS_1$, $LSS_1$, $HSS_2$, $LSS_2$, the designations G, Dr and S are in each case arranged. However, these designations of the terminals are only optional. They designate the drain, gate or source terminals if the switching elements are implemented as n-channel MOSFETs.

According to an embodiment, the switching elements are implemented as power transistors in each case individual chips and the half bridge 10 and the half bridge 11 are accommodated next to one another in a semiconductor package in such a manner that the chip of the first switching element $HSS_1$ is accommodated underneath the chip of the second switching element $LSS_1$ and the chip of the first switching element $HSS_2$ is accommodated underneath the chip of the second switching element $LSS_2$.

FIG. 3 shows details of the switching elements according to FIG. 2. On the left-hand side, a switching element with the three terminals Dr, G and S is drawn. This switching element which, for example, represents the first switching element $LSS_1$ of the first half bridge 10 is thus constructed as an n-channel MOSFET. The terminal S of the switching element is connected to the ground potential.

On the right-hand side of FIG. 3, the first switching element $LSS_1$ is also shown. However, this switching element $LSS_1$ is constructed as a p-channel MOSFET. The terminal designated by Dr is connected to a ground voltage supply whereas the terminal S must be connected to the node $Z_1$. A corresponding implementation will be shown in FIG. 4 in the text which follows.

FIG. 4 shows an embodiment of a circuit arrangement, with p-channel transistors. The circuit according to FIG. 4 essentially corresponds to the circuit according to FIG. 2. However, the switching elements $HSS_1$, $LSS_1$, $HSS_2$, $LSS_2$ are constructed as p-channel MOSFETs. The terminal designated by S as source terminal is in each case connected to the higher potential.

According to an embodiment, the transistors of the switching elements of the first half bridge 10 and of the second half bridge 11 are implemented individually as chips and are then jointly accommodated in a semiconductor package. This provides for a space-saving accommodation of the switching elements in a buck converter.

Embodiments in which additional freewheeling diodes are additionally accommodated in the semiconductor package in parallel with the switching elements of the first half bridge 10 and of the second half bridge 11 are not shown.

It is also possible to implement the switching elements by means of IGBTs, by bipolar power transistors or other power transistors, in an embodiment not shown here.

FIG. 5 shows a section through a power semiconductor component which has a circuit arrangement according to an embodiment. The power semiconductor component shows first chips $HS_1$, $HS_2$, $HS_3$, $HS_4$ and second chips $LS_1$, $LS_2$, $LS_3$ and $LS_4$. These are located on a substrate 13.

The power semiconductor component also has external terminals for the drains D, for the gates $G_1$, $G_2$, $G_3$, $G_4$, $G_5$, $G_6$, $G_7$ and $G_8$ and external terminals for source $S_1$, $S_2$, $S_3$, $S_4$, $S_5$, $S_6$, $S_7$ and $S_8$. The four external terminals for the drains D which are located in the four corners of the power component are connected to an electrically conductive substrate 13.

The terminals for the gates $G_1, \ldots, G_8$ and the source $S_1, \ldots, S_8$ are connected to the first chips $HS_1$ to $HS_4$ and the second chips $LS_1$ to $LS_4$ via bonding wires 14. The first chips $HS_1$ to $HS_4$ are arranged on the electrically conductive substrate 13 lying next to one another. The first chips $HS_1$ to $HS_4$ in each case contain a vertical n-channel MOSFET. Those sides forming the drain terminals of the first chips $HS_1$ to $HS_4$ face the electrically conductive substrate 13 and are electrically conductively connected to it. This establishes a connection of the drain areas of the first chips $HS_1$ to $HS_4$ to the external terminals for the drain D.

The side of the first chips $HS_1$ to $HS_4$ containing the gate terminals and the source terminals will be called the top in the text which follows. The tops are electrically conductively connected to the external terminals for the gates $G_2$, $G_4$, $G_6$ and $G_8$ and the source terminals for the source $S_2$, $S_4$, $S_6$, $S_8$ via bonding wires 14.

The second chip $LS_1$ is applied to the first chip $HS_1$, the second chip $LS_2$ is applied to the first chip $HS_2$, the second chip $LS_3$ is applied to the first chip $HS_3$ and the second chip $LS_4$ is applied to the first chip $HS_4$. The second chips $LS_1$ to $LS_4$ also contain vertical n-channel MOSFETs with a bottom with a drain terminal and a top with their gate and source terminals. The second chips $LS_1$ to $LS_4$ are smaller in the horizontal direction than the first chips $HS_1$ to $HS_4$ underneath them. As a result, the terminals for source and gate of the first chips $HS_1$ to $HS_4$ can be attached easily.

The bottom of the second chips $LS_1$ to $LS_4$ is put on the top of the first chips $HS_1$ to $HS_4$ by means of a surface-bonded adhesive or solder connection. The drain areas of the second chips $LS_1$ to $LS_4$ are also electrically conductively connected to the source areas of the first chips $HS_1$ to $HS_4$ via this adhesive or solder connection.

On the top of the second chips $LS_1$ to $LS_4$, terminals for source and gates are located which are connected to the respective external terminals for the gates $G_1$, $G_3$, $G_5$ and $G_7$ and for the source $S_1$, $S_3$, $S_5$ and $S_7$, respectively, via bonding wires 14.

In FIG. 5, a scale is provided on the left-hand side. The electrically conductive substrate 13 has a size of about 10.2 mm×6.3 mm. Accordingly, the circuit arrangement can be accommodated in a P-DSO-20 package.

It can be seen that the bonding wires 14 for the gate terminals $G_1$ to $G_8$ are thinner than the bonding wires 14 for the source terminals $S_1$ to $S_8$ because they need to conduct less current.

In the case of a conventional processor power supply on a motherboard with 8 phases and a current capacity of approx. 20 A per phase, a multi-phase buck converter needs 16 chips. Instead of accommodating these in 16 power semiconductor packages of the P-TDSON-8 type, they can be implemented in two power packages P-DSO-20, according to an embodiment.

The multi-half bridge proposed here can be used for distinctly reducing the space requirement necessary today, at the same time reducing the assembly costs.

In FIG. 5, the first chips $HS_1$ to $HS_4$ and second chips $LS_1$ to $LS_4$ are constructed as n-channel MOSFETs. In a corresponding implementation with p-channel MOSFETs, the second chips LS$_1$ to LS$_4$ are arranged at the bottom and the first chips HS$_1$ to HS$_4$ are arranged at the top.

Figure 6:
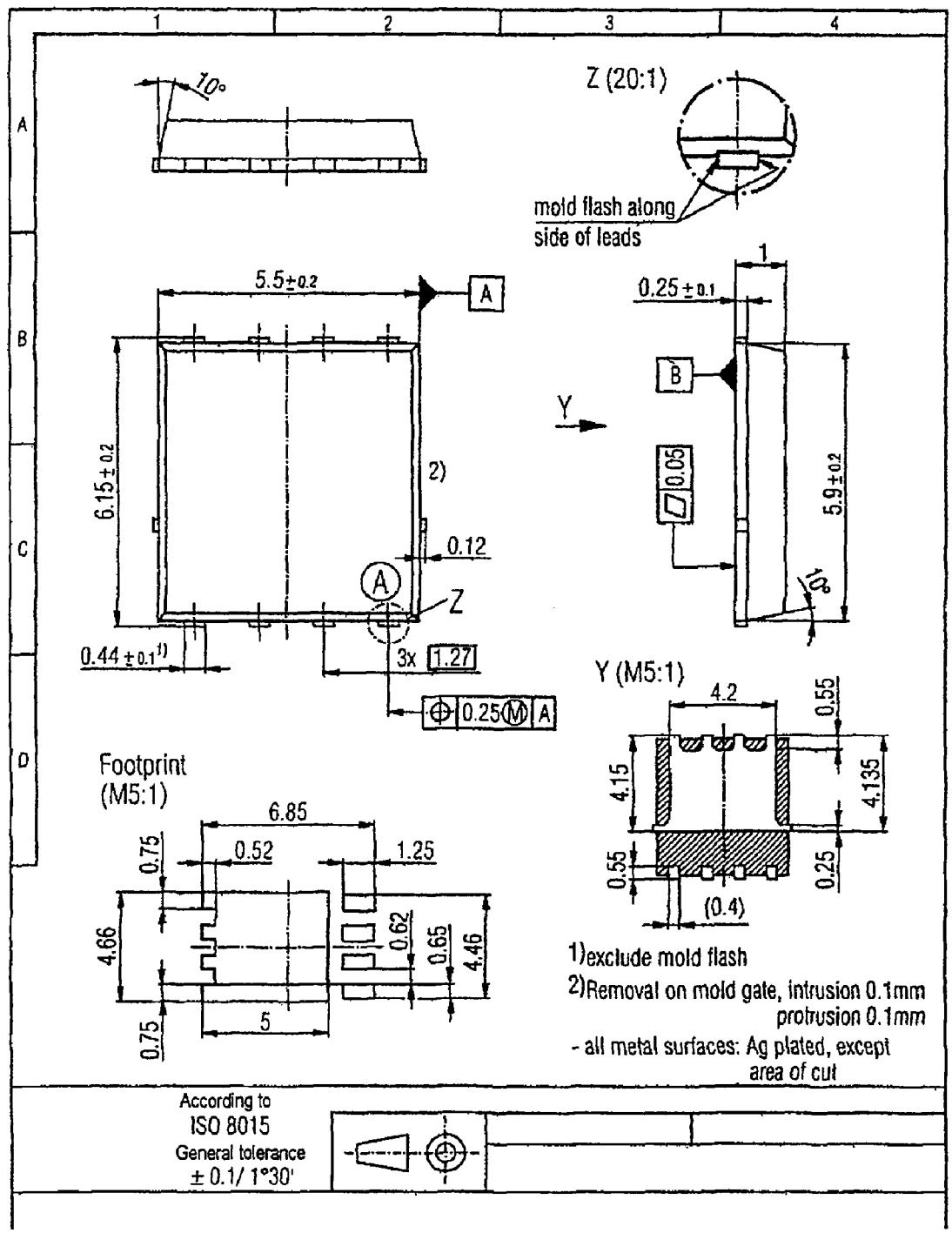
FIG. 6 is the drawing of a P-TDSON-8 package.

FIG. 6 shows the package drawing of a P-TDSON-8 package, the footprint of which is about 6.85 mm×4.66 mm.

Figure 7:
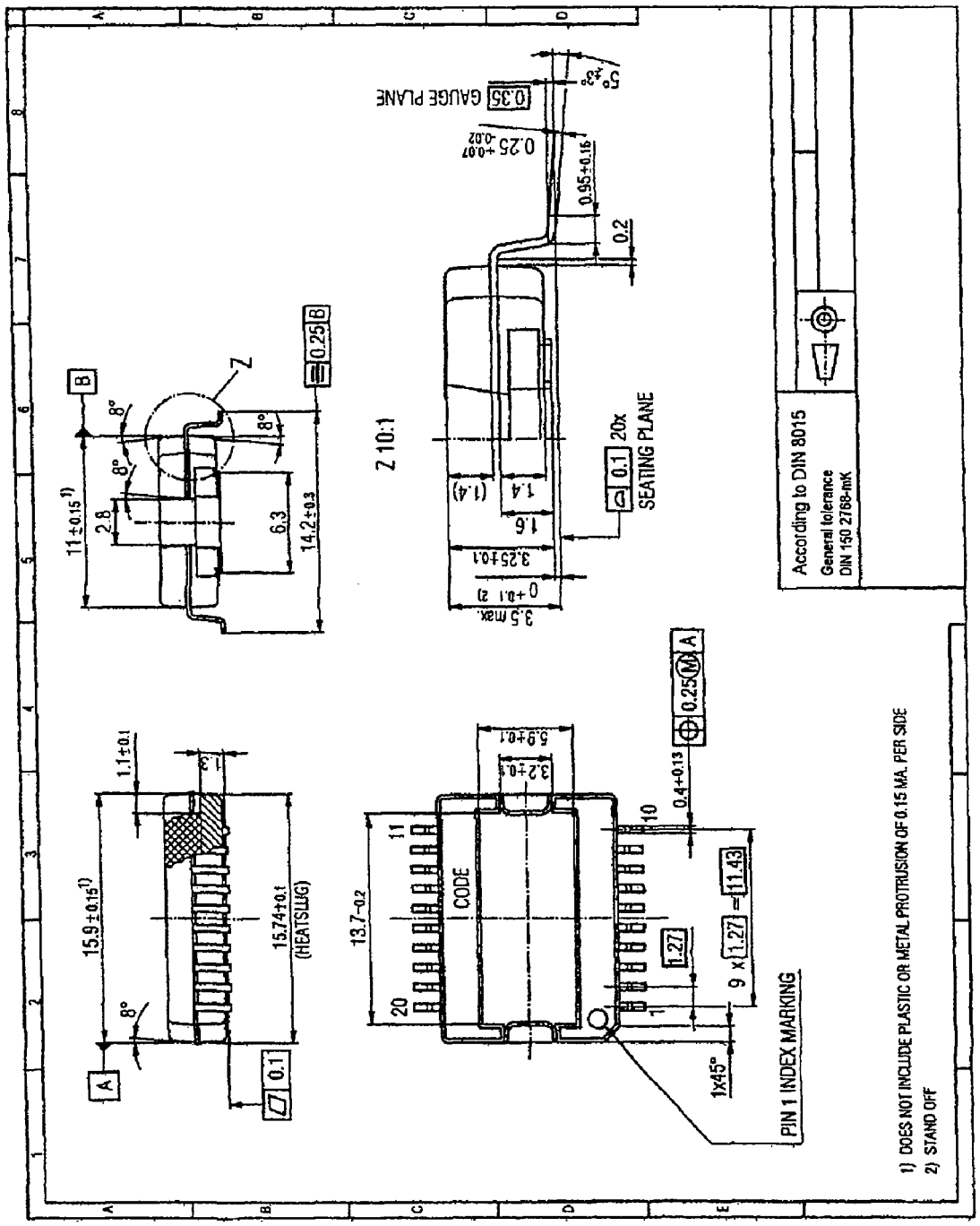
FIG. 7 shows a P-DSO package.

FIG. 7 shows the size relationships of P-DSO packages, the first external terminal and last external terminal of which a package side are 11.43 mm apart. Accordingly, the circuit arrangement according to FIG. 4 can be accommodated in this package.

LIST OF REFERENCE DESIGNATIONS

10 First half bridge
11 Second half bridge
13 Electrically conductive substrate
14 Bonding wire
G$_1$, G$_2$, ... G$_8$ External terminal for gate
S$_1$, S$_2$, ... S$_8$ External terminal for source
D External terminal for drain
G, Dr, S Gate, drain, source terminal
L, L$_1$, L$_2$ Inductance
C, C$_1$, C$_2$ Capacitor
HS, HS$_1$, HS$_2$, HS$_3$, HS$_4$ First chip (high-side)
LS, LS$_1$, LS$_2$, LS$_3$, LS$_4$ Second chip (low-side)
HSS, HSS$_1$, HSS$_2$ First switching element (high-side switch)
LSS, LSS$_1$, LSS$_2$ Second switching element (low-side switch)
Z, Z$_1$, Z$_2$ Intermediate node
U$_e$ Input voltage
U$_a$ Output voltage

What is claimed is:

1. A circuit arrangement comprising a plurality of half bridges, each half bridge containing a first chip and a second chip, the first chip and the second chip each having a vertical power transistor, wherein the first and second chips of each of the half bridges are different chips than the first and second chips of the remaining half bridges, wherein load paths of the power transistor of the first chip and of the power transistor of the second chip are connected in series and control inputs of the power transistors are configured to be driven individually, wherein the half bridges are jointly accommodated in one semiconductor package, and wherein, for each of the half bridges, the second chip of the half bridge is mounted on the first chip of the half bridge, wherein for each of the half bridges, the load path of the power transistor of the first chip is electrically connected to the load path of the power transistor of the second chip, respectively via an electrically conductive solder or adhesive connection which connects the first chip in a surface-bonded manner to the second chip.

2. The circuit arrangement according to claim 1, wherein for each of the half bridges, the first chip and the second chip are connected to one another via a soft solder connection.

3. The circuit arrangement according to claim 1, wherein for each of the half bridges, the first chip and the second chip are connected to one another via a diffusion solder connection.

4. The circuit arrangement according to claim 1, wherein the power transistors of the first chips and of the second chips are IGBTs (insulated gate bipolar transistors).

5. The circuit arrangement according to claim 1, wherein the power transistors of the first chips and of the second chips are bipolar power transistors.

6. The circuit arrangement according to claim 1, wherein the power transistors of the first chips and of the second chips are power MOSFETs.

7. The circuit arrangement according to claim 1, wherein the first chips are applied on an electrically conductive substrate and are electrically conductively connected to the substrate, respectively by means of one of the terminals of the load path of the power transistor.

8. The circuit arrangement according to claim 1, wherein the control terminals of the first and of the second chips and those terminals for the load path which face away from the substrate are connected to the external terminals of the power semiconductor component which is bounded by the semiconductor package via bonding wires.

9. The circuit arrangement according to claim 1, wherein for each of the half bridges, an input voltage is connected across the electrically conductive substrate and the terminal of the load path of the transistor of the second chip which faces away from the first chip.

10. The circuit arrangement according to claim 1, wherein for each of the half bridges, the first chip has a larger seating area than the second chip in each half bridge at a joint between the first chip and the second chip.

11. The circuit arrangement according to claim 1, wherein the circuit arrangement has freewheeling diodes which are accommodated in the semiconductor package and are connected in parallel with the power transistors of the half bridges.

12. The circuit arrangement according to claim 1, wherein the circuit arrangement has exactly four half bridges which are jointly accommodated in one P-DSO-20 package.

13. The circuit arrangement according to claim 1, wherein the circuit arrangement is constructed as part of a multi-phase buck converter which provides an output voltage for a load, an inductance is connected between the load and the connection from the first chip to the second chip for each half bridge, and the power transistors of different half bridges are driven at different times which correspond to different phases.

14. The circuit arrangement according to claim 1, wherein the power transistors of the first chips and of the second chips are of the same type of conductivity.

15. An apparatus, comprising:
a package;
a first half-bridge circuit comprising a first semiconductor chip and a second semiconductor chip, each of the first and second semiconductor chips comprising a power transistor and being disposed within the package; and
a second half-bridge circuit comprising a third semiconductor chip and a fourth semiconductor chip, each of the third and fourth semiconductor chips comprising a power transistor and being disposed within the package,
wherein load paths of the power transistor of the first chip and of the power transistor of the second chip are connected in series, load paths of the power transistor of the third chip and of the power transistor of the fourth chip are connected in series, the second chip is mounted on the first chip, and the fourth chip is mounted on the third chip.

16. The apparatus of claim 15, wherein control inputs of the power transistors of each of the first and second semiconductor chips are configured to be driven individually.

17. The apparatus of claim 15, further comprising:
a third half-bridge circuit comprising a fifth semiconductor chip and a sixth semiconductor chip, each of the fifth and sixth semiconductor chips comprising a power transistor and being disposed within the package; and
a fourth half-bridge circuit comprising a seventh semiconductor chip and an eighth semiconductor chip, each of the seventh and eighth semiconductor chips comprising a power transistor and being disposed within the package,
wherein load paths of the power transistor of the fifth chip and of the power transistor of the sixth chip are connected in series, load paths of the power transistor of the seventh chip and of the power transistor of the eighth chip are connected in series, the sixth chip is mounted on the fifth chip, and the eighth chip is mounted on the seventh chip.

* * * * *

UNITED STATES PATENT AND TRADEMARK OFFICE
CERTIFICATE OF CORRECTION

PATENT NO. : 8,023,276 B2
APPLICATION NO. : 11/550165
DATED : September 20, 2011
INVENTOR(S) : Ralf Otremba It is certified that error appears in the above-identified patent and that said Letters Patent is hereby corrected as shown below:

On the title page, Item (57) in the Abstract, Line 8:
Please delete "($LS_1$, $LS_2$, LS3, $LS_4$)" and insert --($LS_1$, $LS_2$, $LS_3$, $LS_4$)--

On the title page, Item (57) in the Abstract, Line 12:
Please delete "($HS_1$, HS2, HS3, $HS_4$)" and insert --($HS_1$, $HS_2$, $HS_3$, $HS_4$)--

Signed and Sealed this
Twenty-sixth Day of February, 2013

Teresa Stanek Rea
*Acting Director of the United States Patent and Trademark Office*